(12) United States Patent
Chen et al.

(10) Patent No.: US 8,799,864 B2
(45) Date of Patent: Aug. 5, 2014

(54) PROVIDING SYSTEMVERILOG TESTING HARNESS FOR A STANDARDIZED TESTING LANGUAGE

(75) Inventors: Junjie Chen, Shanghai (CN); Xiangdong Ji, Hefei (CN)

(73) Assignee: Synopsys, Inc., Mountain View, CA (US)

( * ) Notice: Subject to any disclaimer, the term of this patent is extended or adjusted under 35 U.S.C. 154(b) by 79 days.

(21) Appl. No.: 13/614,877

(22) Filed: Sep. 13, 2012

(65) Prior Publication Data
US 2013/0067437 A1 Mar. 14, 2013

Related U.S. Application Data

(60) Provisional application No. 61/534,353, filed on Sep. 13, 2011.

(51) Int. Cl.
*G06F 9/44* (2006.01)
*G06F 9/45* (2006.01)

(52) U.S. Cl.
USPC ............ 717/124; 717/106; 717/137; 717/140

(58) Field of Classification Search
None
See application file for complete search history.

(56) References Cited

U.S. PATENT DOCUMENTS

| | | | | |
|---|---|---|---|---|
| 5,560,009 A * | 9/1996 | Lenkov et al. | | 717/124 |
| 5,768,564 A * | 6/1998 | Andrews et al. | | 717/137 |
| 6,944,848 B2 * | 9/2005 | Hartman et al. | | 717/124 |
| 2004/0088685 A1 * | 5/2004 | Poznanovic et al. | | 717/140 |
| 2006/0174221 A1 * | 8/2006 | Kinsella et al. | | 717/106 |
| 2006/0195822 A1 * | 8/2006 | Beardslee et al. | | 717/124 |
| 2008/0148236 A1 * | 6/2008 | Huang et al. | | 717/124 |
| 2009/0070738 A1 * | 3/2009 | Johnson | | 717/106 |

OTHER PUBLICATIONS

Szabo, Janos Zoltan, et al., Experiences of TTCN-3 Test Executor Development—Testing of Communicating Systems XIV, 2002, pp. 192-200.*
Spear, Chris, SystemVerilog for Verification, 2010, pp. 217-259.*
Rezzano, Ricardo et al., TTCN-3 Interoperability Between Java and C/C++ Platforms, 2008, 15 pages.*
Madorsky, A., Darin, et al. VPP—A Verilog HDL Simulation and Generation Library for C++, 2007, 7 pages.*
Das, Sunil R. et al., An Improved Fault Simulation Approach Based on Verilog with Application to ISCAS Benchmark Circuits, 2006, 6 pages.*
D'Amore, Roberto, et al., A Synthesis-Oriented VHDL Course, 2010, 24 pages.*
ETSI ES 201 873-9 V4.5.1, "Methods for Testing and Specification (MTS); The Testing and Test Control Notation version 3; Part 6: TTCN-3 Control Interface (TCI)," <http://www.etsi.org/deliver/etsi_es/201800_201899/20187306/04.05.01_60/es_20187306v040501p.pdf>, Apr. 2013, 340 pages.

(Continued)

*Primary Examiner* — Thuy Dao
*Assistant Examiner* — Christopher Franco
(74) *Attorney, Agent, or Firm* — HIPLegal LLP; Judith A. Szepesi

(57) ABSTRACT

A method and apparatus to enable SystemVerilog based tools to compile, debug, and execute a standardized testing language based test bench. The testing harness comprises, in one embodiment, a translator to map TTCN-3 language to a SystemVerilog test bench, a Verilog syntax compiler and simulator database including the mapped TTCN-3 language data, and a run time system using the SystemVerilog test bench with the database including the mapped TTCN-3 language data.

20 Claims, 11 Drawing Sheets

(56) References Cited

OTHER PUBLICATIONS

ETSI ES 201 873-9 V4.5.1, "Methods for Testing and Specification (MTS); The Testing and Test Control Notation version 3; Part 9: Using XML schema with TTCN-3," <http://www.etsi.org/deliver/etsi_es/201800_201899/20187309/04.05.01_60/es_20187309v040501p.pdf>, Apr. 2013, 122 pages.

SystemVerilog, "SystemVerilog 3.1a Language Reference Manual," <http://www.eda.org/sv/SystemVerilog_3.1a.pdf>, May 31, 2004, 585 pages.

Systems on Silicon, "VHDL to SystemVerilog Translation," <http://www.syosil.com/files/vhdl2sv_translation_brief.pdf>, Accessed Mar. 5, 2014, 3 pages.

* cited by examiner

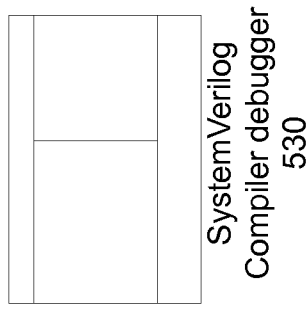
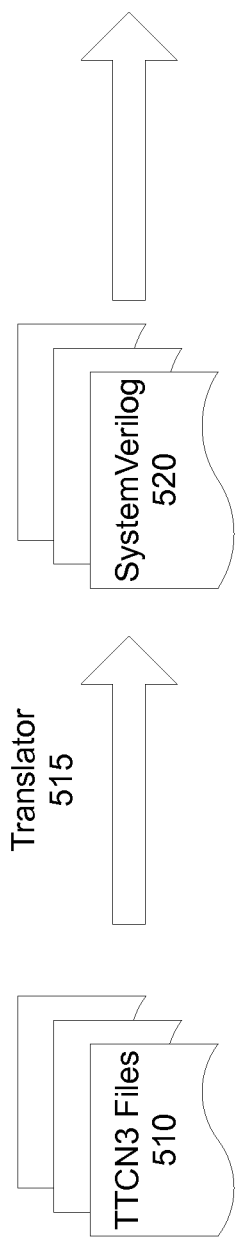
Fig. 5A
Fig. 5B

PROVIDING SYSTEMVERILOG TESTING HARNESS FOR A STANDARDIZED TESTING LANGUAGE

RELATED APPLICATION

The present application is related to U.S. Provisional Patent Application No. 61/534,353, filed Sep. 13, 2011. That application is incorporated herein by reference in its entirety.

FIELD OF THE INVENTION

The present invention relates to system testing, and more particularly to using SystemVerilog based testing harness with a standardized testing language.

BACKGROUND

Testing and Test Control Notation Version 3 (TTCN-3) is an internationally standardized testing language that applies to a variety of application domains and types of testing such as telecommunications protocols, real-time testing, software testing, automotive, load testing, finance, and other fields. For a complex system under test (SUT) the bottlenecks of current TTCN-3 compiler/debugger is performance, capacity, and reliability.

One prior art method of overcoming the limitations of TTCN-3 tools is using a TTCN-3 test system that is designed to compile the TTCN-3 test suite to C++. One existing prior art compiler uses third party tools, like VC, to obtain an executable test suite (ETS), dynamic configure system adapter, codec, and platform adapter. However, even translated into C++, the prior art system has the same limitations as TTCN-3.

SUMMARY

A method and apparatus to enable SystemVerilog based tools to compile, debug, and execute a standardized testing language based test bench is described.

BRIEF DESCRIPTION OF THE DRAWINGS

The present invention is illustrated by way of example, and not by way of limitation, in the figures of the accompanying drawings and in which like reference numerals refer to similar elements and in which:

FIG. 5A is a block diagram of one embodiment of translation using source mapping.

FIG. 5B is a block diagram of one embodiment of translation using abstract syntax tree mapping.

DETAILED DESCRIPTION

The method and apparatus described uses a SystemVerilog harness to implement a standard testing language based testing suite. For example, TTCN-3 is an internationally standardized testing language, which applies to a variety of application domains and types of testing such as Telecom Protocols, Real-Time Testing, Software Testing, Automotive, Load Testing, and Finance. However, for a complex system under test (SUT) TTCN-3 compiler/debugger tools have performance, capacity, and reliability bottlenecks.

In contrast, SystemVerilog based test benches are primarily used with EDA verification tools such as VCS, NC-Sim, or ModelSim. Such tools have significantly better performance, capacity, and reliability. The present system, in one embodiment, combines the SystemVerilog test harness with the structure and language set provided by the TTCN-3 testing language, or test bench, to provide a more efficient, complete, and speedy testing implementation. This is possible because TTCN-3 and SystemVerilog have similar verification methodologies and similar data structure definitions. Based on the comparability between TTCN-3 and SystemVerilog, a new method of a SystemVerilog based TTCN-3 compiler/debugger is provided to enable users to compile and debug TTCN-3 test benches with SystemVerilog compiler and debugger. This solution addresses a long-felt need for a testing suite that has excellent performance, capacity, and reliability and applies to broad application domains and types.

The following detailed description of embodiments of the invention make reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional, and other changes may be made without departing from the scope of the present invention. The following detailed description is, therefore, not to be taken in a limiting sense, and the scope of the present invention is defined only by the appended claims.

Figure 1:
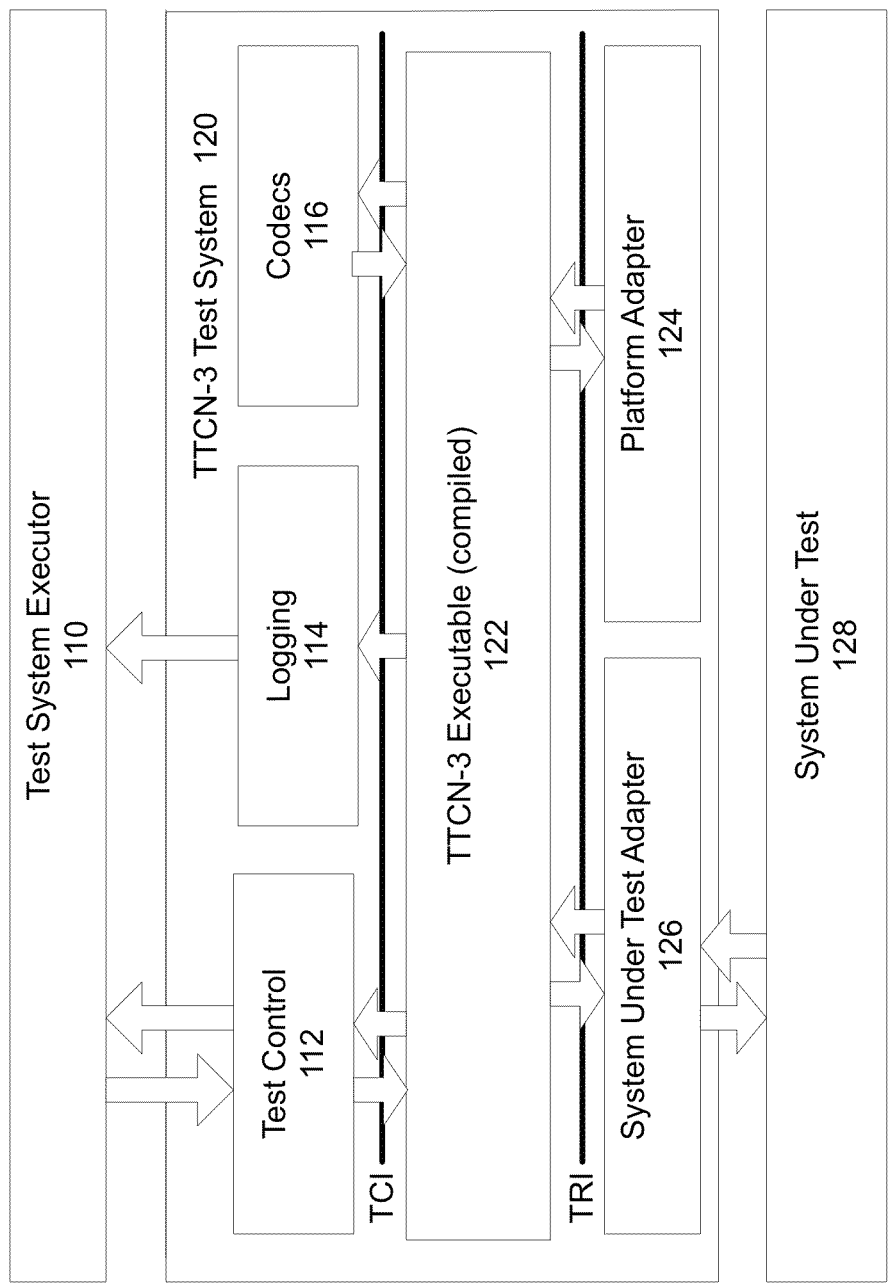
FIG. 1 is a block diagram of one embodiment of a TTCN-3 test environment.

FIG. 1 is a block diagram of one embodiment of a TTCN-3 test environment. The TTCN-3 system includes an executor 110, and a system under test 128. Between the executor 110 and the system under test (SUT) 128, is the TTCN-3 test system 120. The test system includes a compiled executable 122, test controls 112, and codecs 116. In one embodiment, the TTCN-3 test system 120 also includes a System under test adapter 126, which adapts the test suite to the particular system under test 128. A platform adapter 124 adapts to the platform within which the test is being performed. The TTCN-3 test system 120 may further include logging component 114, which logs the result of the test. The combination of the SUT adapter 126 and platform adapter 124 enables the use of the TTCN-3 test system 120 for a broad set of systems and applications.

Figure 2:
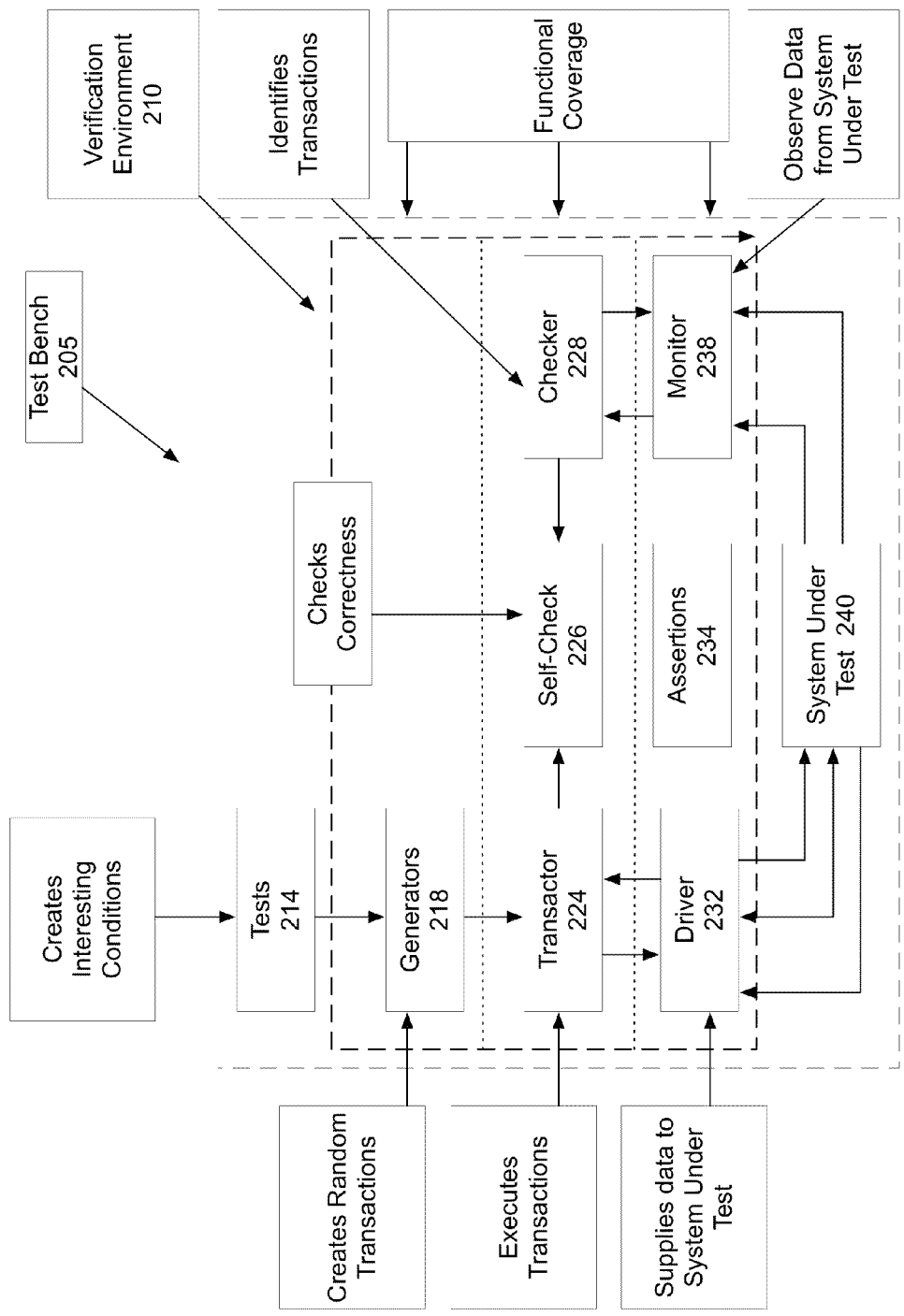
FIG. 2 is a block diagram of one embodiment of a SystemVerilog testing environment.

FIG. 2 is a block diagram of one embodiment of a SystemVerilog testing environment. The system includes a test bench 205, including a verification environment 210. The verification environment 210 is coupled to the system under test 240.

The test bench 205 includes tests 214, which create the test conditions, and generators 218. The verification environment 210 includes layers that create transactions, execute transactions, and supply data to the system under test.

Generators 218 create random transactions for testing. Transactor 224 executes the transactions generated by generators 218. In one embodiment, embedded assertions 234 capture the "design intent" in terms of functionality and constraints, and are verified by simulation before application of any formal or dynamic verification methods. The self-check 226 checks the transaction for correctness, while the checker 228 identifies the transactions involved. The transactor also supplies the data to the system under test via driver 232. Monitor 238 observes the data from the system under test 240 in response to the data from transactor 224. Checker 228 correlates the data from monitor and transactor. In this way, the SystemVerilog testing environment can generate test cases, provide functional coverage, and test a system under test 240. The SystemVerilog environment is designed for large scale testing, and scales well and is reliable even when simultaneously testing thousands of systems.

Figure 3A:
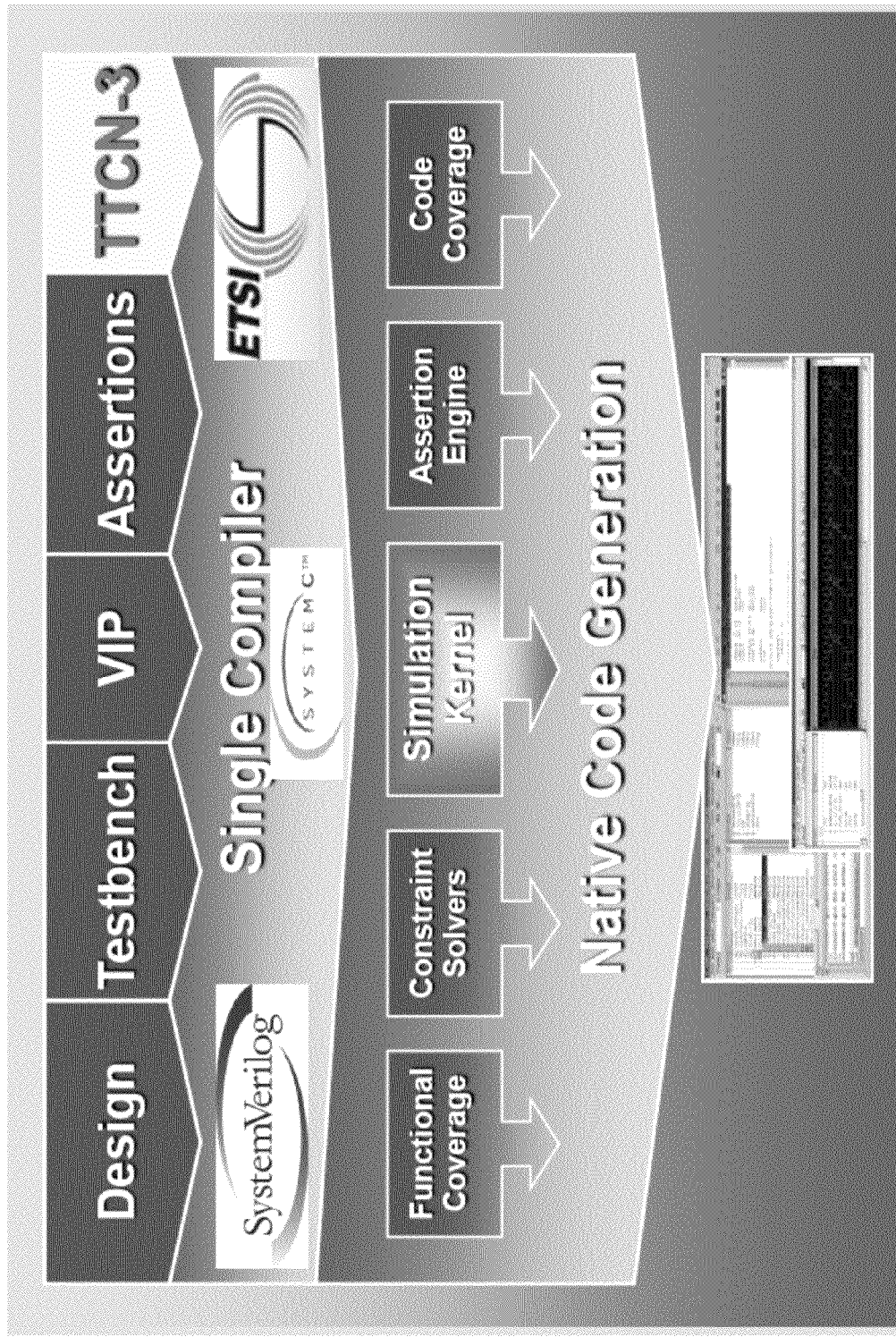
FIG. 3A is an overview block diagram of one embodiment of the system.

FIG. 3A is an overview block diagram of one embodiment of the system. SystemVerilog is a unified hardware description and verification language (HDVL) standard. SystemVerilog (IEEE 1800™) is targeted at the integrated circuit implementation and verification flow, with support for the system-level design flow. SystemVerilog extends to modeling and verification at the "transaction" level of abstraction. SystemVerilog's Direct Programming Interface (DPI) enables it to call functions, and be called by functions in C/C++/SystemC. SystemVerilog can be used for co-simulation with SystemC blocks, providing a link between system level design, chip implementation, and verification.

SystemVerilog may further include a set of extensions to address advanced design requirements. SystemVerilog also supports assertion-based verification (ABV), enabling a "design for verification" methodology. Assertion information is built into SystemVerilog. Embedded assertions capture the "design intent" in terms of functionality and constraints, and are verified by simulation before application of any formal or dynamic verification methods. This approach helps to avoid encoding errors, increases test accuracy, simplifies the test bench, and enables test reuse. The full controllability and observability of internal circuit nodes afforded by ABV can reduce design debug time.

SystemVerilog also supports hardware models and test benches that utilize object-oriented techniques, and are thus reusable. For example, the combination of SystemVerilog's Interface method with object-oriented test bench creation techniques enables the implementation of a powerful constraint-driven verification methodology. The constraints are supplied by embedded assertions that express design properties to be proved true, or to be covered during verification. Such assertions may be re-used in a System-On-Chip (SOC) development that leverages design re-use and/or Intellectual Property (IP)-based design.

Figure 3B:
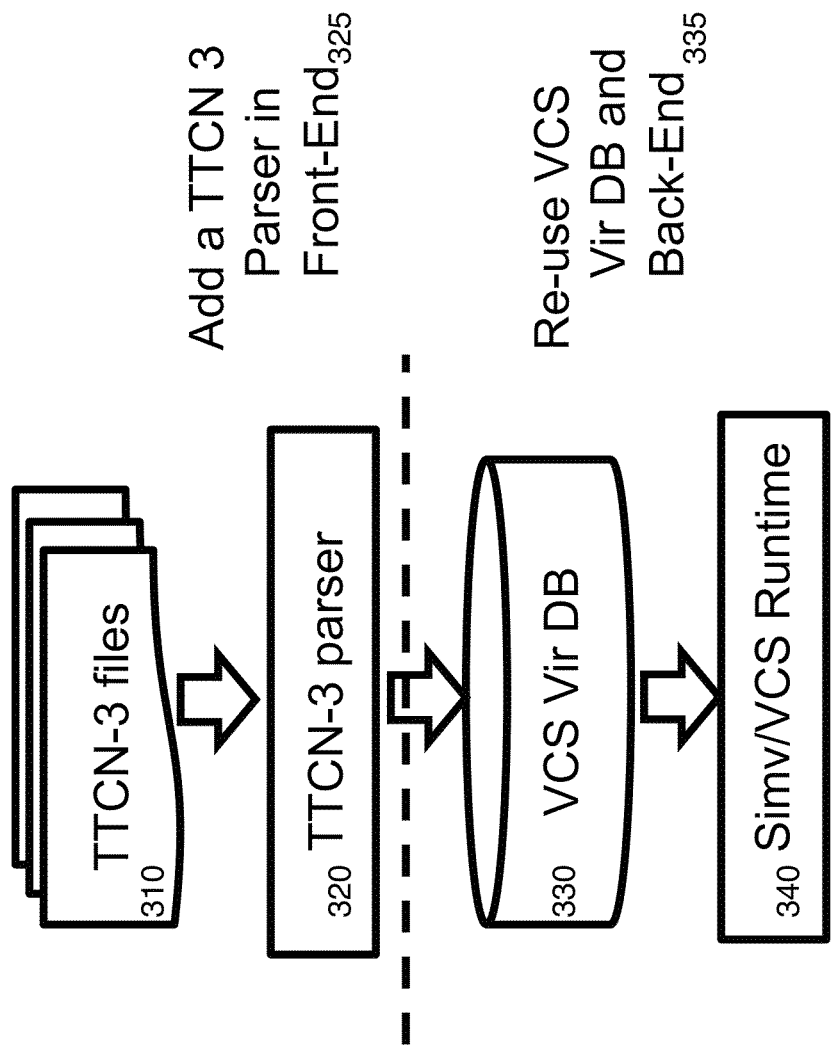
FIG. 3B is an overview diagram of one embodiment of the architecture of the system.

FIG. 3B is an overview block diagram of one embodiment of the architecture of the system. The system unifies TTCN-3 files 310 and the SystemVerilog syntax compiler and simulator (VCS) into a single system. In one embodiment, the system uses TTCN-3 files 310, and a TTCN parser 320 added on the front end 325, with a SystemVerilog syntax compiler and simulator (VCS) vir database 330, and a Simv/VCS Runtime 340 on the back end 335. These elements are referred to as the TTCN-3 language, in connection with a SystemVerilog test harness. In one embodiment, Simv is the output of the compilation, which is an executable binary file. When the Simv is executed, the outputs from the VCS and simulation are shown. By merging the TTCN-3 files and parser with the VCS database and runtime/simulation tools, the combined system provides an enhanced testing experience.

Figure 4:
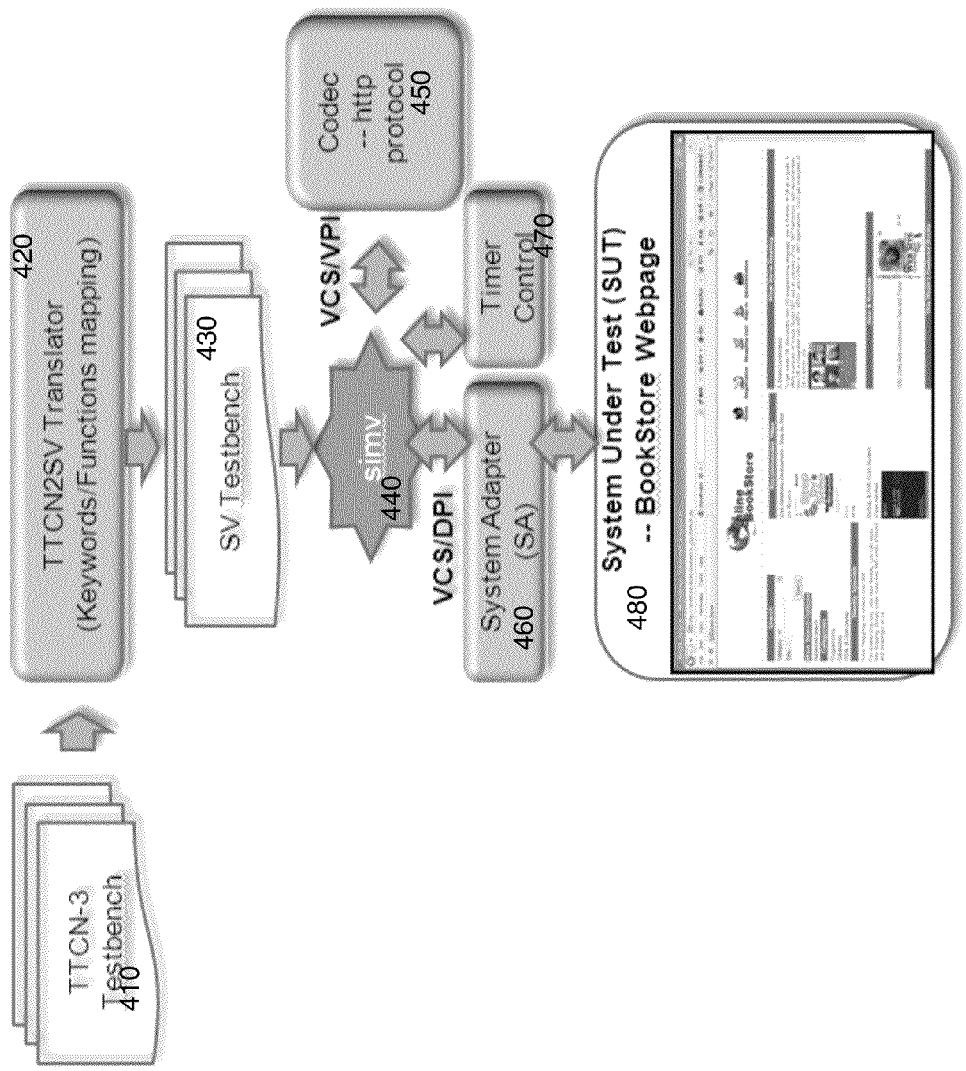
FIG. 4 is a flowchart of using a SystemVerilog harness for TTCN-3 testing in one exemplary testing environment.

FIG. 4 is a flowchart of using a SystemVerilog harness for TTCN-3 testing in one exemplary testing environment. As noted above, TTCN-3 has applicability in a wide range of industries, including telecommunications and web-based design. This example shows a webpage system as the system under test. One of skill in the art would understand that this testing methodology may be extended to many industries and technologies.

The TTCN-3 test bench 410 is passed to the TTCN2SV translator 420. The translator 420 maps keywords, functions, and test cases from the TTCN-3 test bench into a SystemVerilog test bench 430. FIG. 5A and FIG. 5B illustrate exemplary embodiments of mapping a function from the TTCN-3 into the SystemVerilog test bench.

The SystemVerilog test bench 430 includes the SIMV 440 (the output of the compilation, an executable binary file). The SIMV 440 interacts with the system under test 480 via system adapter 460. The system may include a DPI (direct programming interface), which provides an interface between SystemVerilog and C or any other language, which allows inter-language function calls. Verilog Procedural Interface (VPI) allows the system to control the task/function library. In one embodiment, the VPI enables interaction with, and control through, Codec 450, using an http (hypertext transport protocol). Timer control 470 interacts with the SIMV system as well.

Thus, in one embodiment, the SystemVerilog test bench is used to interact with the device under test 480, while using tools to enable the SystemVerilog test bench to take advantage of the keywords/functions provided by the TTCN-3 test bench 410.

FIG. 5A is a block diagram of one embodiment of translation using source mapping. In one embodiment, the TTCN-3 files 510 are passed through a translator 515 to generate SystemVerilog files 520, which correspond to the keywords and functions provided by the TTCN-3 test bench. The SystemVerilog compiler/debugger 530 is then used, with the keywords and functions obtained from the TTCN-3 files. This is considered "source mapping" as the source TTCN-3 files are directly mapped or translated into SystemVerilog files. Based on the comparability between TTCN-3 and SystemVerilog, the system can be used to translate TTCN-3 test bench source codes to SystemVerilog test bench source codes and meet the same verification functions. Then the system uses SystemVerilog compiler/debugger to compile, run, and debug the generated SystemVerilog test benches.

FIG. 5B is a block diagram of an alternative embodiment of translation using abstract syntax tree mapping. The TTCN-3 files 550 are parsed into an abstract syntax tree 550, by parser 565. The abstract syntax tree (AST) 550 is a tree-like representation of the syntactic structure of source code. Each node of the tree denotes a construct occurring in the source code. The syntax is abstract in that it does not represent every detail that appears in the real syntax.

The SystemVerilog AST 575 is generated, using match logic 580, to produce a SystemVerilog AST 575 including the TTCN-3 AST 560 features. The SystemVerilog AST 575 is then used 570 by the SystemVerilog compiler/debugger 590. In this way, instead of direct translation, the ASTs are cross-mapped. Based on the comparability between TTCN-3 and SystemVerilog, the system uses the TTCN-3 AST generated by TTCN-3 parser to create SystemVerilog AST and meet the same verification functions.

In one embodiment, the system can be a combination of the two mapping mechanisms show in FIGS. 5A and 5B. In one embodiment, to select partial TTCN-3 test benches the system follows a "Source to Source mapping mechanism" and to handle the remaining partial TTCN-3 test benches the system follows "AST to AST mapping mechanism." In one embodiment, those aspects that cannot be mapped through source-to-source mapping are mapped using AST to AST mapping.

Figure 6:
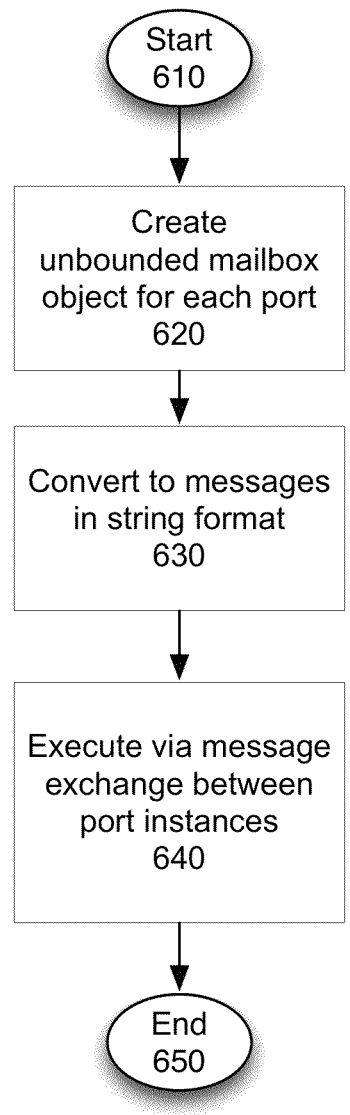
FIG. 6 is an overview flowchart of one embodiment of the messaging process.
Figure 7A:
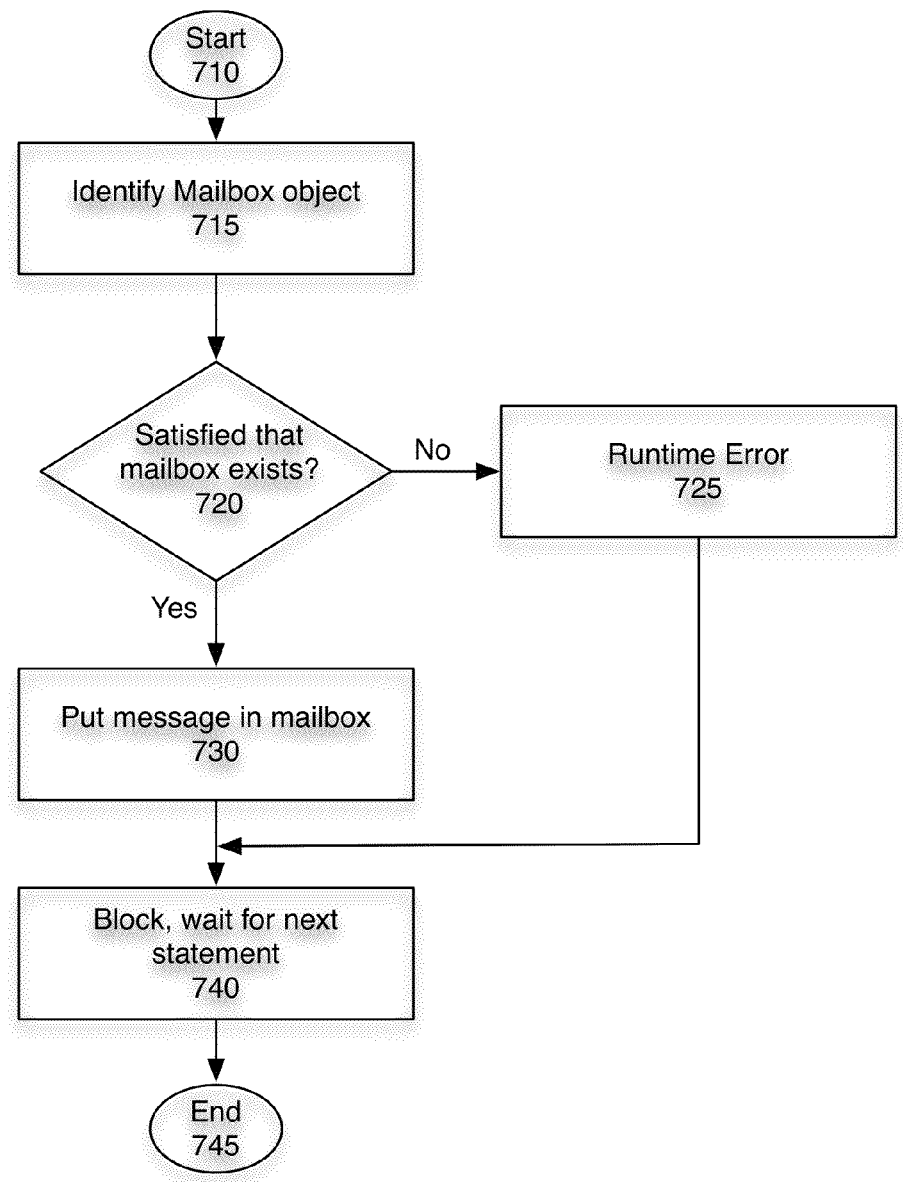
FIG. 7A is a flowchart of one embodiment of a send operation, using the system.
Figure 7B:
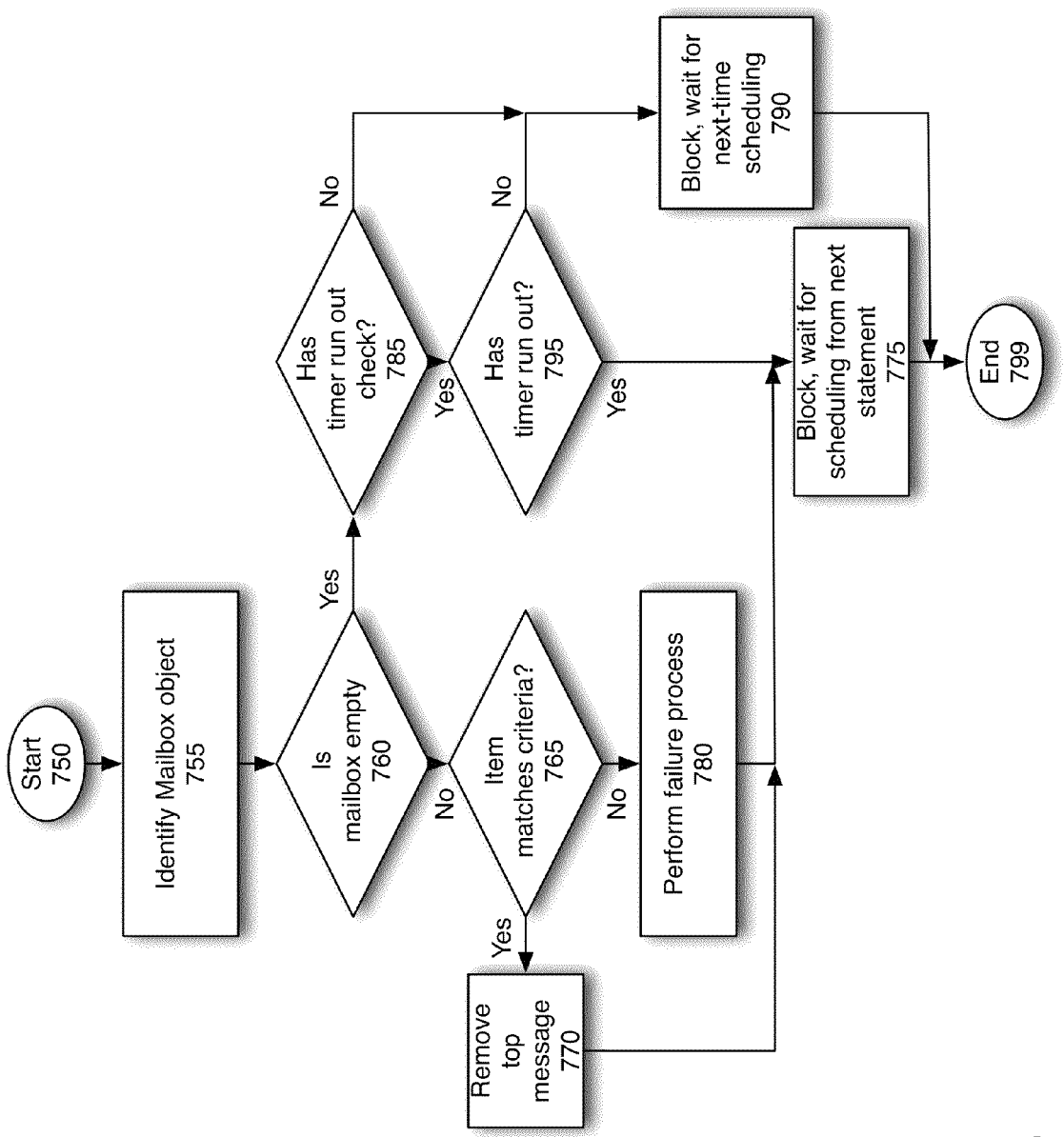
FIG. 7B is a flowchart of one embodiment of a receive operation, using the system.

FIGS. 6, 7A, and 7B are flowcharts of one embodiment of a send and receive operation, using the system. Because the system utilizes as its basis TTCN-3 functions and a SystemVerilog test harness, the discrepancies between the two systems are addressed. In one embodiment, functional cross-mapping is used to address discrepancies. The example provided in FIGS. 6, and 7A-7B is with respect to communication operations of TTCN-3 based on SystemVerilog. One of skill in the art would understand that a similar methodology may be applied to other communication or command features.

One of the key capabilities of TTCN-3 is its communication mechanism. TTCN-3 provides message-based and signature-based communication operations. These operations can be grouped into two categories, sending operations and receiving operations. The system is designed to ensure that the SystemVerilog testing harness can properly execute the sending and receiving operations of the TTCN-3 language.

In one embodiment, the method of executing TTCN-3 communication operations makes use of SystemVerilog 'mailbox', which allows more efficient execution of message exchanging and results in an unified way to implement both message-based and signature-based communication operations.

FIG. 6 is an overview flowchart of one embodiment of the messaging process. At block 610, the process starts. At block 620, the process creates an unbounded SystemVerilog mailbox object for each TTCN-3 port instance.

At block 630, the TTCN-3 messages, procedure calls, replies, and exceptions are converted to messages in string format. In one embodiment, this encompasses all communications associated with the TTCN-3 system.

At block 640, the execution of TTCN-3 sending and receiving operations is implemented via exchanging messages between TTCN-3 port instances. In general, TTCN-3 uses port-based messaging system. By converting each port-based TTCN-3 message to a SystemVerilog mailbox bound message, the communications mechanisms of the TTCN-3 language remain, but are operated within the mailbox system of SystemVerilog. The process ends at block 650. In one embodiment, this mapping occurs once for each testing system that is integrated.

FIG. 7A is one embodiment of the sending operation. In one embodiment, a TTCN-3 sending operation may include send, call, reply, or raise. The process starts at block 710. At block 715, the process identifies the mailbox object of a port instance that is connected or mapped to the sending port instance and satisfies the criteria specified by the operation. Each message type is matched to a particular port, in one embodiment.

If no such mailbox exists, as determined at block 720, a runtime error is generated, at block 725. The process in one embodiment continues to block 730, where the process is blocked, to await the next statement. This thread of the process ends.

The presence of a runtime error indicates that the mapping, described above with respect to FIG. 6, was not complete. The operator can update the mapping to ensure that the mailbox objects targeted by send operations exist. If the mailbox is identified at block 720, the process calls a 'put( )' method for the mailbox to place a message in the mailbox, at block 730.

The current process is then blocked at block 740, to await the next statement, and ends, block 745. In one embodiment, this means that the process is suspended but continues to actively wait for further send operations. This process is initiated whenever a send operation is needed, in one embodiment.

FIG. 7B is one embodiment of a receiving operation. The process starts at block 750. For any TTCN-3 receiving operation, i.e. receive, trigger, get call, get reply, or catch, at block 755, the process identifies the mailbox object of the receiving port instance.

At block 760, the process determines whether the mailbox is empty. If the mailbox is not empty, in one embodiment the system calls a 'peek( )' method to get the first message from the mailbox and check with the matching criteria specified by the operation, at block 765. The process, in one embodiment, then calls a 'get( )' method to remove the message from mailbox queue if it satisfies the criteria, at block 770. The process then continues to block 775, to block, and wait for the scheduling from the next statement.

If the message does not match the criteria specified by the operation, as determined at block 765, the process at block 780 the failure process is performed. In one embodiment, the failure process returns the control back to the system, and the system determines the action to perform in response to the failure. In one embodiment, this depends on the TTCN-3 code that was implemented. The process then continues to block 775, to wait for scheduling from a next statement.

If the mailbox was found to be empty, at block 760, at block 785 the process determines whether the timer check is due. If not, the process waits for the next time scheduling increment, at block 790. If it is time to check the timer, at block 795, the timer is checked. If the timer has not yet run out, the process continues to block 790 to wait. If the timer has run out, at block 775, the process terminates to wait for the scheduling from the next statement, which may cause a receiving operation.

In this way, the mapping enables the communication of TTCN-3 style message-based and signature-based operations within the mailbox-based structure of the SystemVerilog test harness.

Figure 8:
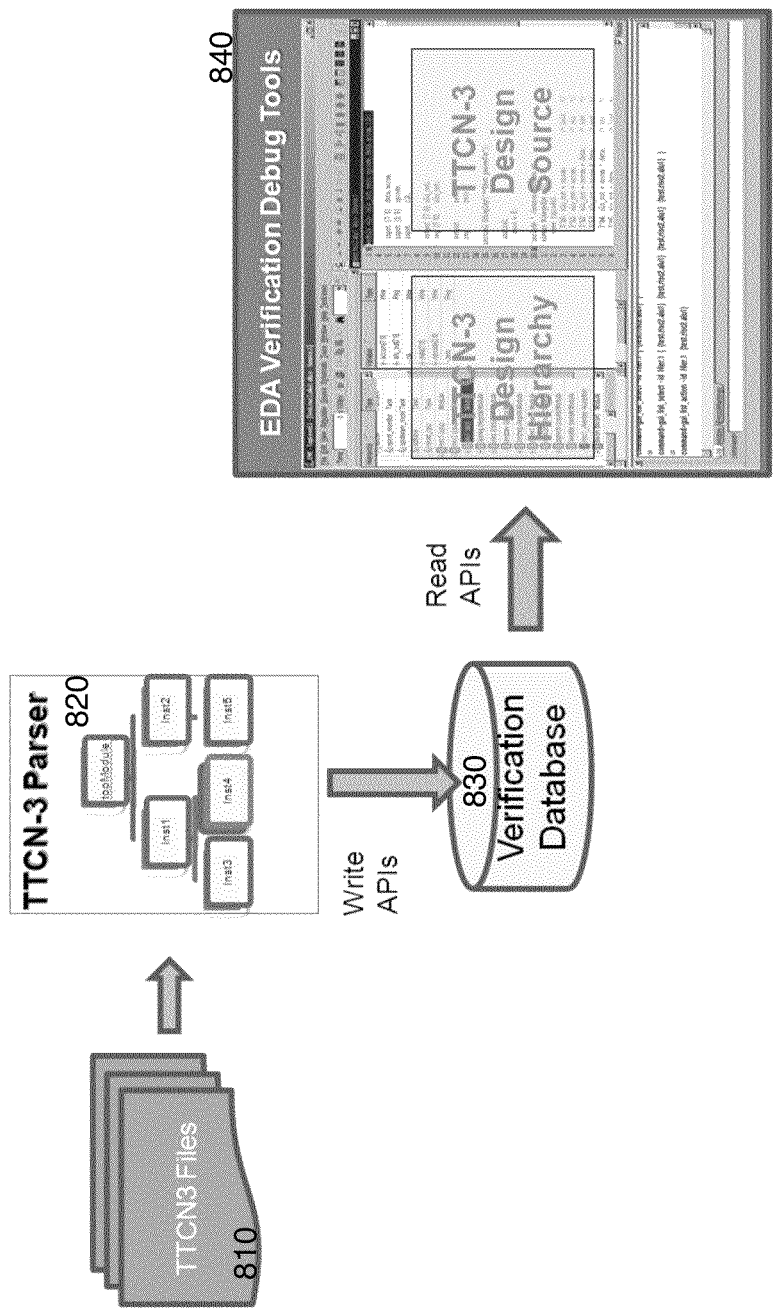
FIG. 8 is a block diagram of one embodiment of verification using EDA verification tools.

FIG. 8 is a block diagram of one embodiment of verification using electronic design automation (EDA) verification tools. EDA verification tools designed for SystemVerilog can be adapted to the TTCN-3 language based system described above. In one embodiment, a SystemVerilog based TTCN-3 compiler/debugger is provided to enable users to compile and debug TTCN-3 test benches with SystemVerilog compiler and debugger.

In one embodiment, the process includes using an EDA verification database 830, based on TTCN-3 parser data 820, to enable users to reuse the EDA verification database 830 for TTCN-3 static debugging. EDA verification tools 840 use some verification databases 830 for static debug. One verification database is VCD (IEEE standard), which contains static debug information like HDL design hierarchy and value changes. Other verification databases include Synopsys' VPD, Sprintsoft's FSDB, and others.

In order to enable the reuse of the EDA verification database, the TTCN-3 parser 820 uses the TTCN-3 files 810, to create an abstract syntax tree (AST) 825.

The system then reuses the write APIs (application programming interfaces) of the EDA verification database to update the verification database 830 with static information of TTCN-3 files. The static debug information may include hierarchy information like scope information such as module, control, function, test case, alt step, and variable information.

The static debug information may also include source file information, connectivity information, and scopes and variables.

The EDA verification debug tools 840 can then use the APIs to read the static debug database of TTCN-3 test benches and enable the static debug features of TTCN-3 test benches.

In this way the EDA verification and debug tools 840 can be used to handle testing of the TTCN-3 based test architecture. It enables the use of an existing infrastructure for testing, with the present system. One of skill in the art would understand that the process described here with respect to the EDA verification database could be used with other verification databases similarly.

Figure 9:
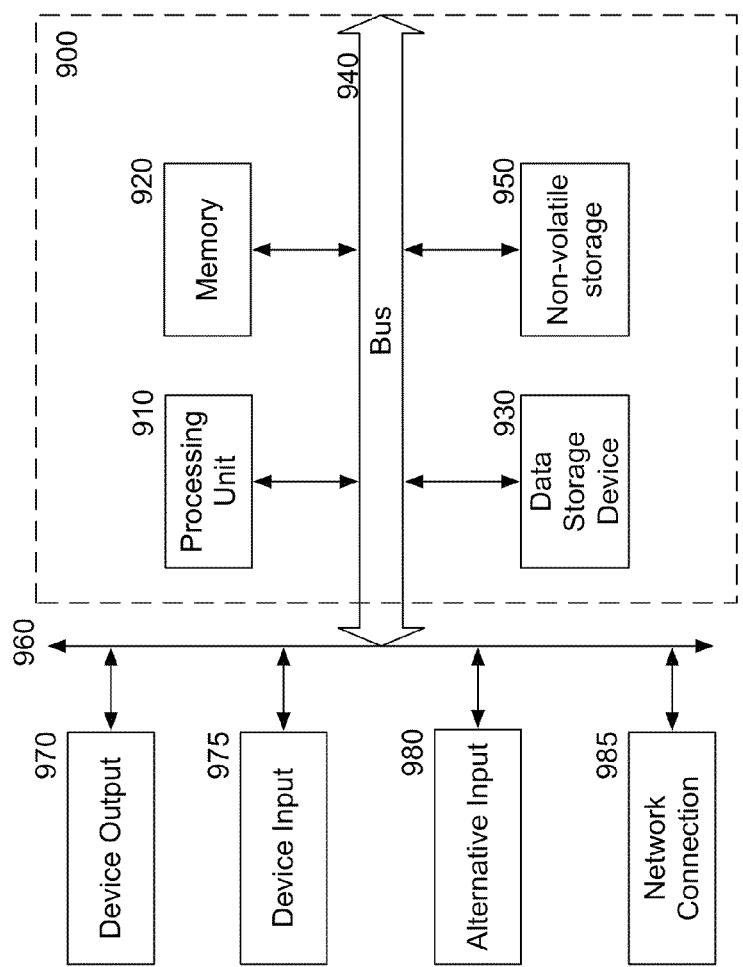
FIG. 9 is a block diagram of one embodiment of a computer system with which the present invention can be used.

FIG. 9 is a block diagram of one embodiment of a computer system with which the present invention can be used. FIG. 9 is a block diagram of a particular machine, which may be used with the present invention. It will be apparent to those of ordinary skill in the art, however that other alternative systems of various system architectures may also be used.

The data processing system illustrated in FIG. 9 includes a bus or other internal communication means 940 for communicating information, and a processing unit 910 coupled to the bus 940 for processing information. The processing unit 910 may be a central processing unit (CPU), a digital signal processor (DSP), or another type of processing unit 910.

The system further includes, in one embodiment, a random access memory (RAM) or other volatile storage device 920 (referred to as memory), coupled to bus 940 for storing information and instructions to be executed by processor 910. Main memory 920 may also be used for storing temporary variables or other intermediate information during execution of instructions by processing unit 910.

The system also comprises in one embodiment a read only memory (ROM) 950 and/or static storage device 950 coupled to bus 940 for storing static information and instructions for processor 910. In one embodiment, the system also includes data storage device 930 such as a magnetic disk or optical disk and its corresponding disk drive, or Flash memory or other storage that is capable of storing data when no power is supplied to the system. Data storage device 930 in one embodiment is coupled to bus 940 for storing information and instructions.

The system may further be coupled to an output device 970, such as a cathode ray tube (CRT) or a liquid crystal display (LCD) coupled to bus 940 through bus 960 for outputting information. The output device 970 may be a visual output device, an audio output device, and/or tactile output device (e.g. vibrations, etc.)

An input device 975 may be coupled to the bus 960. The input device 975 may be an alphanumeric input device, such as a keyboard including alphanumeric and other keys, for enabling a user to communicate information and command selections to processing unit 910. An additional user input device 980 may further be included. One such user input device 980 is cursor control device 980, such as a mouse, a trackball, stylus, cursor direction keys, or touch screen, may be coupled to bus 940 through bus 960 for communicating direction information and command selections to processing unit 910, and for controlling movement on display device 970.

Another device, which may optionally be coupled to computer system 900, is a network device 985 for accessing other nodes of a distributed system via a network. The communication device 985 may include any of a number of commercially available networking peripheral devices such as those used for coupling to an Ethernet, token ring, Internet, or wide area network, personal area network, wireless network, or other method of accessing other devices. The communication device 985 may further be a null-modem connection, or any other mechanism that provides connectivity between the computer system 900 and the outside world.

Note that any or all of the components of this system illustrated in FIG. 9 and associated hardware may be used in various embodiments of the present invention.

It will be appreciated by those of ordinary skill in the art that the particular machine that embodies the present invention may be configured in various ways according to the particular implementation. The control logic or software implementing the present invention can be stored in main memory 920, mass storage device 930, or other storage medium locally or remotely accessible to processor 910.

It will be apparent to those of ordinary skill in the art that the system, method, and process described herein can be implemented as software stored in main memory 920 or read only memory 950 and executed by processor 910. This control logic or software may also be resident on an article of manufacture comprising a computer readable medium having computer readable program code embodied therein and being readable by the mass storage device 930 and for causing the processor 910 to operate in accordance with the methods and teachings herein.

The present invention may also be embodied in a handheld or portable device containing a subset of the computer hardware components described above. For example, the handheld device may be configured to contain only the bus 940, the processor 910, and memory 950 and/or 930.

The handheld device may be configured to include a set of buttons or input signaling components with which a user may select from a set of available options. These could be considered input device #1 975 or input device #2 980. The handheld device may also be configured to include an output device 970 such as a liquid crystal display (LCD) or display element matrix for displaying information to a user of the handheld device. Conventional methods may be used to implement such a handheld device. The implementation of the present invention for such a device would be apparent to one of ordinary skill in the art given the disclosure of the present invention as provided herein.

The present invention may also be embodied in a special purpose appliance including a subset of the computer hardware components described above. For example, the appliance may include a processing unit 910, a data storage device 930, a bus 940, and memory 920, and no input/output mechanisms, or only rudimentary communications mechanisms, such as a small touch-screen that permits the user to communicate in a basic manner with the device. In general, the more special-purpose the device is, the fewer of the elements need be present for the device to function. In some devices, communications with the user may be through a touch-based screen, or similar mechanism. In one embodiment, the device may not provide any direct input/output signals, but may be configured and accessed through a website or other network-based connection through network device 985.

It will be appreciated by those of ordinary skill in the art that any configuration of the particular machine implemented as the computer system may be used according to the particular implementation. The control logic or software implementing the present invention can be stored on any machine-readable medium locally or remotely accessible to processor 910. A machine-readable medium includes any mechanism for storing information in a form readable by a machine (e.g. a computer). For example, a machine-readable medium includes read-only memory (ROM), random access memory (RAM), magnetic disk storage media, optical storage media, flash memory devices, or other storage media that may be used for temporary or permanent data storage. In one embodiment, the control logic may be implemented as transmittable data, such as electrical, optical, acoustical, or other forms of propagated signals (e.g. carrier waves, infrared signals, digital signals, etc.).

This conversion was implemented in a prototype to enable VCS to verify TTCN-3 test bench by auto translating TTCN-3 to SystemVerilog. The prototype included TTCN2SV translator, Codec based on VCS/VPI, System Adaptor based on VCS/DPI. The benchmark results were positive. The SystemVerilog solution performed better than competitive products. In particular when there was only one PTC (client), the Performance Test shows that SystemVerilog Solution has the same performance results as prior art C++ conversion systems. As the number of PTC (clients) increase, the SystemVerilog Solution shows much better performance than C++ conversion. There was an up to 10× increase in speed.

Furthermore, as the number of PTC (clients) increase, the SystemVerilog Solution showed much better stability than the C++ conversion based solution. In one prototype experiment, 100% passed v. 65% passed using the prior method.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A processor-executed method of testing comprising:
mapping Testing and Test Control Notation Version 3 (TTCN-3) test language to a SystemVerilog test bench;
storing the mapped TTCN-3 test language with a SystemVerilog syntax compiler; and
running the SystemVerilog test bench, with the mapped TTCN-3 test language.

2. The method of claim 1, further comprising:
generating a database including the mapping of the TTCN-3 test language, the database used by the SystemVerilog test bench to implement the mapped TTCN-3 test language.

3. The method of claim 1, further comprising:
adapting the SystemVerilog test bench to a system under test (SUT), by including a codec associated with the system type.

4. The method claim 1, wherein the mapping comprises mapping TTCN-3 files directly into SystemVerilog files.

5. The method of claim 1, wherein the mapping comprises mapping an abstract syntax tree of the TTCN-3 files into an abstract syntax tree of SystemVerilog.

6. The method of claim 1, wherein the mapping comprises combination of abstract syntax tree and source mapping.

7. The method of claim 1, further comprising:
mapping communications operations from the TTCN-3 format into the SystemVerilog format.

8. The method of claim 7, wherein the communications operations include message-based and signature-based communication operations, and the communications operations are mapped into a mailbox system.

9. The method of claim 8, further comprising:
creating an unbounded mailbox object for each port, the unbounded mailbox object used via message exchange between port instances to enable the communications operations.

10. A testing harness comprising:
a translator stored in a memory to map Testing and Test Control Notation, Version 3 (TTCN-3) language to a SystemVerilog test bench;
a SystemVerilog syntax compiler and a simulator database, including the mapped TTCN-3 language; and
a run time system using the SystemVerilog test bench with the simulator database including the mapped TTCN-3 language.

11. The testing harness of claim 10, further comprising:
a system adapter to adapt the run time system to a system under test.

12. The testing harness of claim 10, wherein the translator comprises a source mapping translator, mapping TTCN-3 files into SystemVerilog files.

13. The testing harness of claim 10, wherein the translator comprises an abstract syntax tree translator, mapping an abstract syntax tree of the TTCN-3 files into an abstract syntax tree of SystemVerilog files.

14. The testing harness of claim 10, wherein the translator comprises a combination of abstract syntax tree and source mapping translation.

15. The testing harness of claim 10, further comprising:
a communications mapping, to map communications operations from the TTCN-3 format into the SystemVerilog format.

16. The testing harness of claim 15, wherein the TTCN-3 format communications operations include message-based and signature-based communication operations, and the communications operations are mapped into a SystemVerilog mailbox system.

17. The testing harness of claim 16, further comprising:
an unbounded SystemVerilog mailbox object, created for each port, the unbounded mailbox object used via message exchange between port instances to enable the communications operations.

18. A testing apparatus comprising:
a Testing and Test Control Notation, Version 3 (TTCN-3) standardized testing language stored in a memory;
a SystemVerilog testing harness;
a SystemVerilog syntax compiler and a simulator database, including a mapped TTCN-3 standardized testing language; and
a testing set-up including the SystemVerilog testing harness with the TTCN-3 standardized testing language, including mapping functions and communications from the TTCN-3 standardized testing language to SystemVerilog format, such that a runtime system using the SystemVerilog testing harness uses the mapped TTCN-3 standardized testing language.

19. The testing apparatus of claim 18, wherein the testing set-up further comprises a communications set-up to enable the structure of the SystemVerilog testing harness to accept communications from the TTCN-3 standardized testing language format.

20. The testing apparatus of claim 18, wherein the mapping comprises one or both of: mapping TTCN-3 files directly into SystemVerilog files and mapping an abstract syntax tree of the TTCN-3 files into an abstract syntax tree of SystemVerilog.

* * * * *